United States Patent [19]

Cavaciuti et al.

[11] Patent Number: 5,416,625
[45] Date of Patent: May 16, 1995

[54] OPTICAL DEMULTIPLEXING SYSTEM

[75] Inventors: Alessandro Cavaciuti, Turin; Mario Puleo, Borgosesia, both of Italy

[73] Assignee: CSELT - Centro Studi E Laboratori Telecommunicazioni S.p.A., Turin, Italy

[21] Appl. No.: 40,120

[22] Filed: Mar. 30, 1993

[30] Foreign Application Priority Data

May 26, 1992 [IT] Italy .................. TO92A0443

[51] Int. Cl.[6] .............................. H04J 14/08
[52] U.S. Cl. .................. 359/137; 359/123; 359/138
[58] Field of Search ............... 359/115, 118, 119, 123, 359/135, 137, 139, 138

[56] References Cited

U.S. PATENT DOCUMENTS

| 4,726,010 | 2/1988 | Ali et al. | 359/123 |
| 5,175,777 | 12/1992 | Böttle | 359/139 |
| 5,208,691 | 3/1993 | Nishio | 359/123 |

FOREIGN PATENT DOCUMENTS 8909518 10/1989 United Kingdom ............... 359/123

OTHER PUBLICATIONS

P. B. Hansen; "Optical Demultiplexing At 6 Gb/s Using A Semiconductor . . . " IEE Transactions Photonics Technology Letter, vol. 3 #11, Nov. 1991, 3 pages.

R. S. Tucker..; "16 Gbit/s Fibre Transmission Experiment Using Optical Time-Division Multiplexing" Electronic Letters, vol. 23 No. 24, pp. 1270-1271.

P. A. Andrekson..; "All-Optical Demultiplexing At 16 Gbit/s Using Four-Wave Mixing", Technical Digest of OFC'91, San Diego 1991, pp. 19-22.

*Primary Examiner*—David K. Moore
*Assistant Examiner*—Rafael Bacares
*Attorney, Agent, or Firm*—Herbert Dubno

[57] ABSTRACT

Optical demultiplexing system, wherein from an optical carrier modulated by a TDM data flow the wanted tributary is extracted as an optical signal. The system makes use of a semiconductor optical amplifier, whose gain is modulated due to saturation effect. The amplifier receives both the modulated optical carrier and one or a plurality of sampling optical carriers, with wavelengths different from that of the modulated carrier. One or a plurality of optical filters supply at the output the tributaries by extracting from the amplifier output the sampling carriers modulated by data signals.

2 Claims, 1 Drawing Sheet

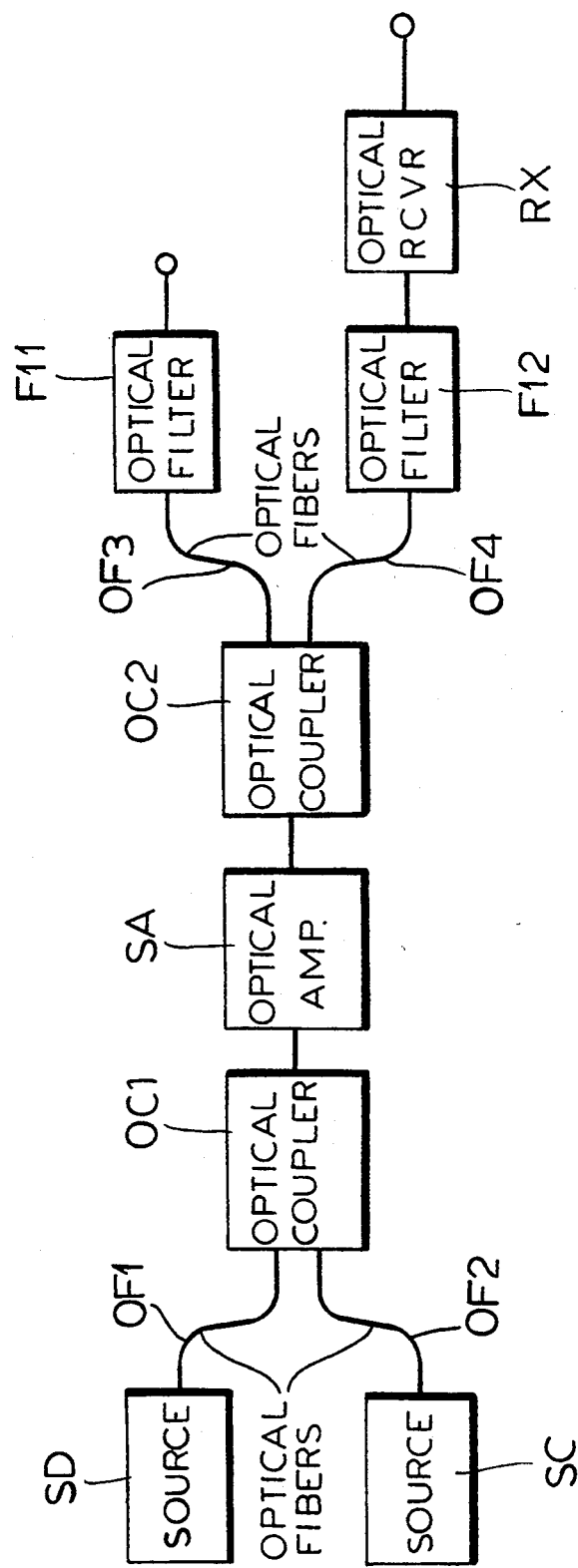

OPTICAL DEMULTIPLEXING SYSTEM

FIELD OF THE INVENTION

The present invention relates to a high bit-rate digital signal transmission system, wherein a plurality of channels are transmitted in time division on an optical fiber by modulating a coherent light radiation and more, particularly, to an optical demultiplexing system.

BACKGROUND OF THE INVENTION

When a digital signal flow composed of a plurality of time-division multiplexed channels (TDM=Time Division Multiplex) arrives at a receiving terminal, it must undergo a demultiplexing operation allowing the extraction of bits belonging to a determined channel. If the transmission is carried out by sending on an optical fiber a light radiation amplitude-modulated by the digital TDM flow, the demultiplexing at the receiving terminal can be carried out according to two different methods:

by converting the whole TDM data flow from optical signals into electrical signals and demultiplexing the signal obtained by suitable electronic circuits of the type commonly used in digital telecommunication apparatus; and by extracting from the TDM data flow only the channel desired by optical devices and converting it into an electric signal for the successive processing operations.

The first method, which is presently the most widely used, requires a broadband optical receiver and demultiplexing electronic circuits operating at the bit rate of the TDM data flow. Good performances in terms of sensitivity are difficult to achieve by the use of wide-band optical receivers and the electronic circuits are particularly critical, especially when operating at bit rates of some Gbit/s.

The second method demands a suitable device which allows the optical signal to be deviated to the receiver exclusively at the instants corresponding to the passage of the bits belonging to the channel to be extracted. Such a device must be capable of operating at a rate comparable with TDM data flow bit rate, requiring as low as possible optical power levels.

Different methods using devices for this purpose have been described in the literature. Such devices include:

—an electro-optical switch, of the type described by R. S. Tucker et al in "16 Gbit/s fiber transmission experiment using optical time-division multiplexing", Electronic Letters, Vol. 23, n.24, pages 1270–1271;

—a semiconductor optical amplifier, switched on only in correspondence with the tributary to be extracted, according to the method described by P. B. Hansen et al in "Optical Demultiplexing at 6 Gbit/s Using a Semiconductor Laser Amplifier as an Optical Gate" IEEE Photonics Technology Letters, Vol. 3, NO. 11, November 1991, pages 1018–1020;

—an optical fiber trunk, whereto the TDM data flow and a suitable sampling signal are sent at the same time and wherefrom the relevant conversion products, generated by non-linearity phenomena, are extracted by a suitable optical filtering operation. This method is described by P. A. Andrekson et al in "All-Optical Demultiplexing at 16 Gbit/s using Four-Wave Mixing", issued in Technical Digest of OFC'91, San Diego 1991, pages 19–22.

The first two methods dramatically degrade TDM data flow integrity, rendering it non-available for further processing operations, while the third requires high signal powers, of the order of 100 mW, and optical signals with wavelengths very close to one another, so as to obtain the desired non-linearity effects in the fiber. The latter requirement demands also the use of very narrow optical filters and highly wavelength-stabilized optical-carriers.

OBJECT OF THE INVENTION

It is an object of the invention to provide an optical demultiplexing system, provided by the present invention, which does not require high power optical signals, is not critical as to the difference between optical signal wavelengths and does not dramatically degrade TDM data flow, thus allowing its further use for successive processing operations. Thy system should operate at high bit rates, while the optical receivers and the electronic circuits can operate at the demultiplexed signal rate.

SUMMARY OF THE INVENTION

The present invention provides an optical demultiplexing system, wherein from an optical carrier at a first wavelength, modulated by a TDM data flow, one or more channels are extracted to be forwarded to the relevant optical receivers for successive processing operations, the system comprises:

—an optical coupler to which the optical carrier at a first wavelength and one or more sampling optical carriers at different wavelengths are sent, consisting of carriers reaching their maximum amplitude only in the time intervals which the relevant tributary to be extracted is present;

—one or more sources generating the sampling optical carriers;

—a semiconductor optical amplifier, whose input receives the sum of the optical carriers present at the output of said optical coupler, the amplifier gain decreasing with the increasing of the total power of input carriers;

—a second optical coupler which subdivides the power supplied at the output by the optical amplifier;

—one or more optical filters with pass band centered on the wavelength of one of the sampling optical carriers to whose input there is sent the signal supplied by the second optical coupler and whose output supplies the tributary to the receivers.

BRIEF DESCRIPTION OF THE DRAWING

The foregoing and other characteristics of the present invention will be made clearer by the following description of a preferred embodiment thereof given by way of non-limiting example, and by the annexed drawing, the sole FIGURE of which shows a block diagram of the optical demultiplexing system.

SPECIFIC DESCRIPTION

The system uses a semiconductor optical amplifier, whose gain is modulated as an effect of the saturation due to the algebraic sum of the powers of the input optical signals, independent of how the power is distributed among the different wavelengths. As a consequence, if an intensity-modulated and an unmodulated optical carrier are sent at the same time to the amplifier, even the second carrier is modulated by saturation effect. If the carriers have different wavelengths, they can be afterwards easily separated.

In the block diagram shown in the FIGURE, a source SD sends to a fiber end OF1 an optical carrier at a wavelength L1, amplitude-modulated by TDM data flow. At the same time, a source SC sends to a fiber end OF2 a sampling optical carrier, i.e. a carrier which reaches its maximum amplitude only in the time intervals wherein the tributary to be extracted is present. This second carrier has a wavelength L2 different from L1.

Two signals at the outputs of the opposite fiber ends are summed in a coupler OC1 and sent to a semiconductor optical amplifier SA. The amplifier gain decreases when the algebraic sum of the powers of the input optical signals increases. Therefore, when the sampling carrier is present and the TDM data signal reaches its maximum power (high logic level), the amplifier gain is lower than at the instants the power of TDM data signal is minimum (low logic level). The sampling signal at the amplifier output is then modulated with inverted logic with regard to the desired tributary.

A coupler OC2 splits the optical signal at the output of the amplifier SA and sends the two parts to two optical fibers OF3 and OF4. An optical filter FI2, having its passband centered on wavelength L2, allows the forwarding to the optical receiver RX of the only sampling signal modulated by the wanted tributary and rejects the FDM data signal at wavelength L1. The latter signal, present on fiber OF3, can be picked up for successive processing operations by a filter FI1 with passband centered on wavelength L1.

Within receiver RX the optical signal relevant to the only wanted tributary is then detected, electronically amplified and possibly inverted to obtain the original digital signal.

If a plurality of channels is to be extracted, it is sufficient to utilize a plurality of sources like SC, each of them capable of generating a sampling carrier with different wavelength L3, L4, etc, and, by using a coupler OC1 with a plurality of inputs, to send at the same time all the optical carriers to optical amplifier SA. Analogously, at SA output a coupler like OC2, with a plurality of outputs, sends to a plurality of optical filters, each of them having a passband centered on the wavelength of one of the sampling carriers, the global optical signal. A corresponding receiver like RX can be placed at the output of each filter.

It is clear that what described has been given only by way of non limiting example. Variations and modifications are possible without going out of the scope of the claims. For example, coupler OC2 and filter FI1 can be omitted if the carrier modulated by TDM data flow is not to be extracted from the signal at the output of amplifier SA.

We claim:

1. An optical demultiplexing system for extracting at least one channel from an optical carrier at a first wavelength (L1) modulated by a TDM data flow and forwarding the extracted channel to an optical receiver, said system comprising:

a first optical coupler having an input receiving said optical carrier at said first wavelength (L1) and at least one other input supplying at least one sampling optical carrier at at least one wavelength (L2, L3, L4, ... ), each sampling optical carrier reaching a maximum amplitude only in a time interval in which the channel to be extracted is present in said optical carrier at said first wavelength (L1), said first optical coupler forming at an output of said first optical coupler an optical output signal representing a sum of the optical carriers supplied to said inputs;

means including a source of said sampling optical carriers connected to said first optical coupler for each sampling carrier supplied thereto;

a semiconductor optical amplifier connected to said output of said first optical coupler and receiving said optical output signal representing said sum of the optical carriers, said semiconductor optical amplifier having an output and an amplifier gain decreasing with increasing total power of said optical carriers supplied to said inputs of said first optical coupler;

a second optical coupler connected to said output of said semiconductor optical amplifier and subdividing power of an optical signal at said output of said semiconductor optical amplifier; and at least one optical filter centered on a passband of a respective wavelength (L2, L3, L4, ... ) of a respective one of said sampling optical carriers, connected to an output of said second optical coupler and having a filter output feeding said channel to said optical receiver.

2. The optical demultiplexing system defined in claim 1, further comprising a further optical filter with a passband centered on the first wavelength (L1) connected to another output of said second optical coupler for extracting an optical carrier modulated with TDM data.

* * * * *